United States Patent [19]
Wu et al.

[11] Patent Number: 5,563,532
[45] Date of Patent: Oct. 8, 1996

[54] DOUBLE FILTERING GLITCH EATER FOR ELIMINATION OF NOISE FROM SIGNALS ON A SCSI BUS

[75] Inventors: Chih-Siung Wu, Saratoga; Kinyue Szeto, San Francisco, both of Calif.

[73] Assignee: Advanced Micro Devices, Inc., Sunnyvale, Calif.

[21] Appl. No.: 186,405

[22] Filed: Jan. 24, 1994

[51] Int. Cl.⁶ ............................................. H03K 5/00
[52] U.S. Cl. ........................ 327/34; 327/31; 327/551; 327/552; 327/270; 327/311; 327/306; 327/165
[58] Field of Search .................... 307/556, 602, 307/603, 601, 520, 521, 243, 542, 542.1; 328/167, 164, 111, 112; 326/30, 93, 94, 26

[56] References Cited

U.S. PATENT DOCUMENTS

| | | | |
|---|---|---|---|
| 3,970,944 | 7/1976 | Huellwegen | 327/34 |
| 4,105,980 | 8/1978 | Cowardin et al. | 328/165 |
| 4,797,585 | 1/1989 | Segawa et al. | 307/602 |
| 5,113,098 | 5/1992 | Teymouri | 327/552 |
| 5,162,666 | 11/1992 | Tran | 307/243 |
| 5,198,710 | 3/1993 | Houston | 327/552 |
| 5,265,038 | 11/1993 | Kwok | 364/572 |
| 5,396,633 | 3/1995 | Mayer et al. | 395/725 |

FOREIGN PATENT DOCUMENTS

| | | |
|---|---|---|
| 0562712A2 | 9/1993 | European Pat. Off. . |
| 60-30224A | 2/1985 | Japan . |

Primary Examiner—Timothy P. Callahan
Assistant Examiner—Dinh T. Le
Attorney, Agent, or Firm—Fliesler, Dubb, Meyer & Lovejoy

[57] ABSTRACT

A glitch filter for eliminating noise pulses less than 12 nanoseconds (ns) created by large devices on the SCSI bus and reflections of the 12 ns pulses created by a long SCSI bus cable, as well as noise pulses on the order of 35 ns typically found on a SCSI bus. The glitch filter includes a Schmitt trigger connected to receive the SCSI bus signal along with three filters connected in series with the Schmitt trigger. The first filter removes positive pulses having a pulse width less than 12 ns and provides an inverted output. The second filter removes negative pulses having a pulse width less than 12 ns and provides an inverted output. The third filter removes pulses having a pulse width less than 35 ns and provides the output of the glitch filter.

13 Claims, 6 Drawing Sheets

LOGIC DIAGRAM

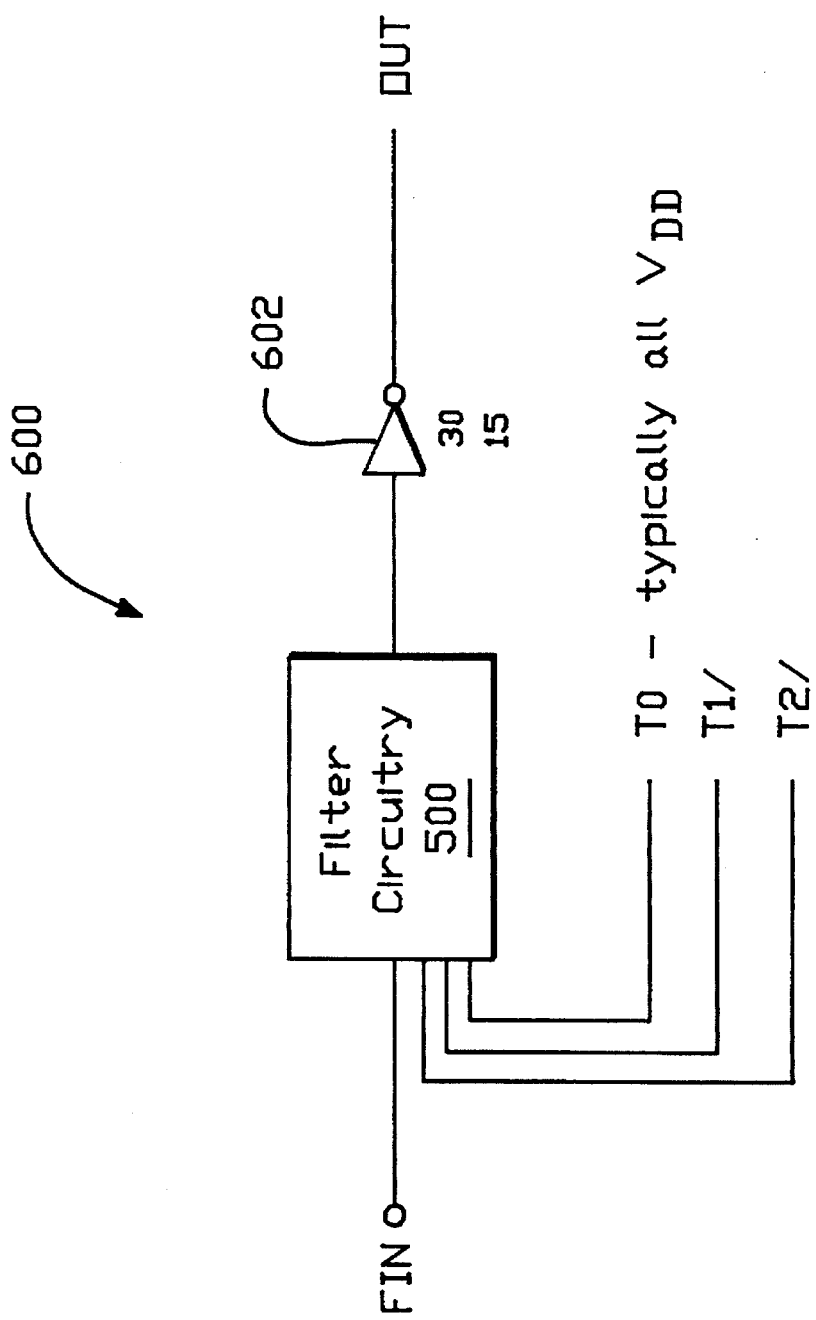

DOUBLE FILTERING GLITCH EATER FOR ELIMINATION OF NOISE FROM SIGNALS ON A SCSI BUS

BACKGROUND OF THE INVENTION

1. Field of the Invention

The present invention relates to CMOS integrated circuitry for elimination of noise from signals received from a SCSI (Small Computer Systems Interface) Bus. More particularly, the present invention relates to such noise elimination circuitry for use on an input buffer of a SCSI bus controller integrated with other components onto a single integrated circuit chip.

2. Description of the Related Art

SCSI is a standard that allows users to easily add up to seven peripheral devices on a personal computer such as CD-ROM and high capacity disk drives. A SCSI adapter board in a personal computer provides a SCSI bus controller which provides digital address, data, and control signals to a SCSI bus on which peripheral devices reside.

FIG. 1 illustrates the configuration of a SCSI bus with connecting devices. As shown, the SCSI bus 100 supports up to seven devices 101–107, with a potential one meter length of cable between the devices. Terminators 108 and 109 are provided at the ends of the SCSI bus cable. Device 1, labeled 101 is the host computer which includes an output buffer 120 and input buffer 130 connected to the SCSI bus line. The signal from the input buffer 130 is fed through a filter 140 to SCSI controller 150. Because of noise on SCSI bus signals, particularly switching noise and ground bounce created by output buffers such as 120, the input buffers can generate erroneous signals. Filters, such as filter 140 have, thus, been used between the input buffer and internal components of the device connected to the SCSI bus such as controller 150. Such a filter is disclosed in U.S. Pat. No. 5,113,098 entitled "Glitch Remover Circuit For Transmission Links", to Teymouri incorporated herein by reference.

More recent devices which operate on a SCSI bus can now generate significantly more noise. See, for example, U.S. patent application Ser. No. 08/186,050 entitled "Integrated SCSI and Ethernet Controller", on a PCI Bus by Chih-Siung Wu, filed Jan. 24, 1994. By integrating a SCSI controller with an Ethernet Controller the transistor count of the device which connects to the SCSI bus increases from nearly 20,000 to over 100,000. By increasing the transistor count in this manner, particularly as integrated circuit processes move to a sub-micron levels, noise on the SCSI bus is increased to a level greater than current filtering can effectively eliminate.

The larger devices on the SCSI bus introduce larger loading and generate additional ground bounce and current switching noise. Additional noise is also created by reflections of the noise created by the larger devices on the SCSI bus due to the long SCSI bus cable lengths. With such additional noise not eliminated by current filtering, input buffers receiving signals from the SCSI bus may once again generate erroneous signals.

Circuitry which responds to such added switching, ground bounce, and reflection noise on a SCSI bus is therefore desired. Such circuitry is particularly desired to protect a SCSI controller logic against false input signal sensing without substantially complicating the SCSI controller design.

SUMMARY OF THE INVENTION

The present invention provides a filter responsive to noise created from larger devices on the SCSI bus.

The present invention filters out such noise caused by ground bounce or current switching during the assertion of a signal, reflection of the noise during the negation of signal, or such noise occurring during transitions between the assertion and negation phases of the signal on the SCSI bus.

The present invention is a filter for filtering noise from a first signal on a SCSI bus as provided by an input buffer comprising:

a schmitt trigger for receiving the first signal and providing a digital signal version of the first signal as a second signal;

a first filter for filtering positive pulses having a pulse width less than 12 nanoseconds from the second signal and inverting the second signal to form a third signal;

a second filter for filtering negative pulses having a pulse width less than 12 nanoseconds from the third signal and inverting the third signal to form a fourth signal;

a third filter for filtering pulses having a pulse width less than 35 nanoseconds from the fourth signal and inverting the fourth signal to form a fifth signal; and an inverter for inverting the fifth signal to form a filter output.

BRIEF DESCRIPTION OF THE DRAWINGS

Further details of the present invention are explained with the help of the attached drawings in which:

FIG. 6 shows detailed circuitry for filter 3 of FIG. 2.

DETAILED DESCRIPTION

Figure 2:
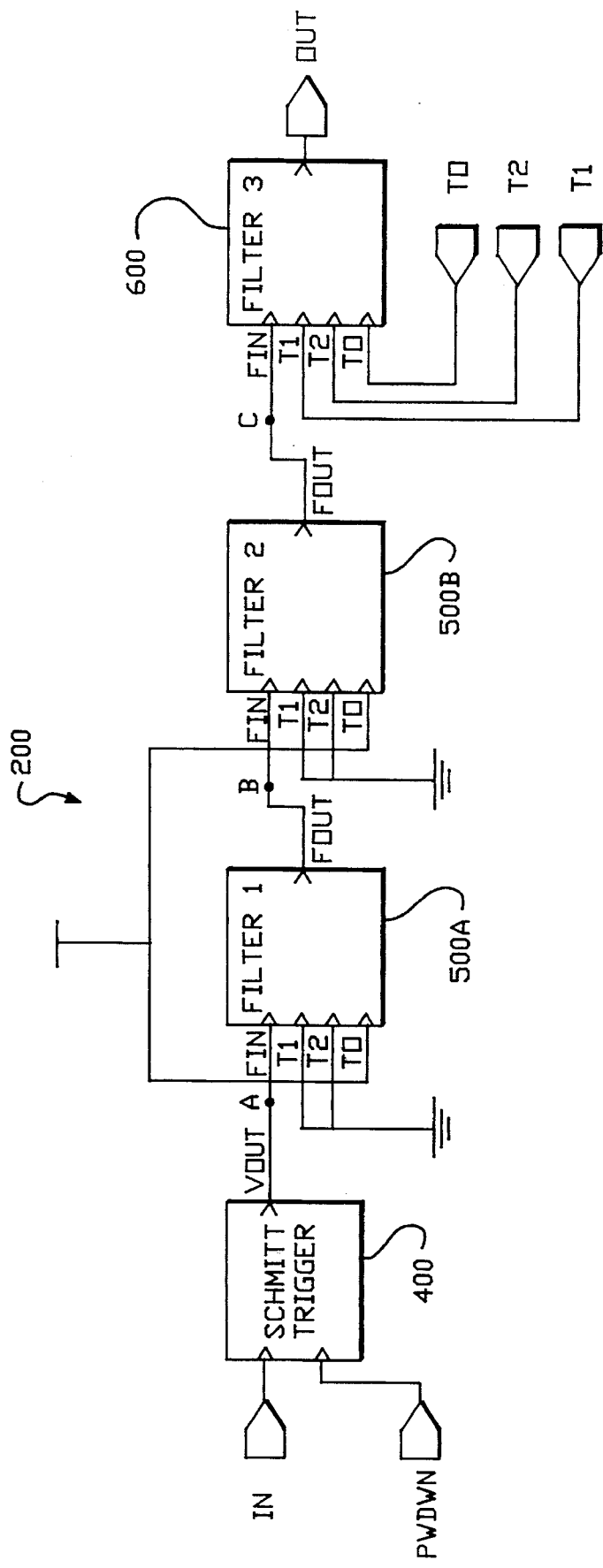
FIG. 2 shows a block diagram of the double filtering glitch eater of the present invention.

FIG. 2 shows a block diagram of the double filtering glitch eater 200 of the present invention. The double filtering glitch eater includes four stages, the first stage being a Schmitt trigger 400, and the second through fourth stages being filters 500A, 500B and 600. FIGS. 3A–3E show signals at particular points in the circuitry of FIG. 2.

Figure 3A:
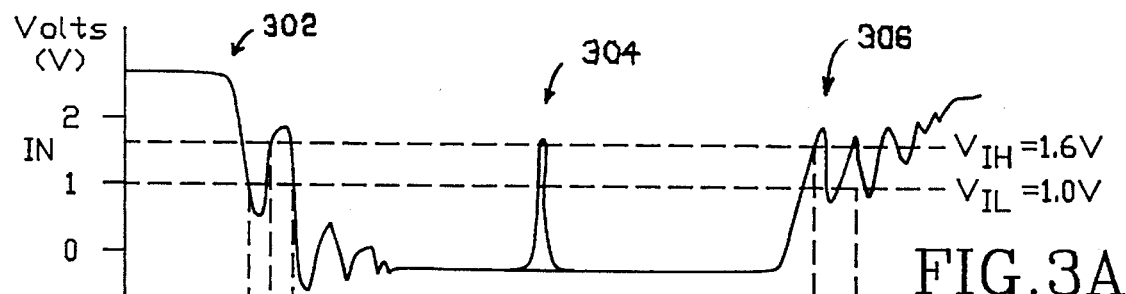
FIG. 3A shows the input signal (IN) as received by the circuitry of FIG. 2 from an input buffer connected to a SCSI bus.

FIG. 3A shows the input signal (IN) as received by the circuitry of FIG. 2 from an input buffer connected to a SCSI bus. As shown, the signal IN includes noise, or oscillations on an assertion edge 302, on a negation edge 306, and in a portion of the signal 304 between the assertion and negation edge.

Figure 3B:
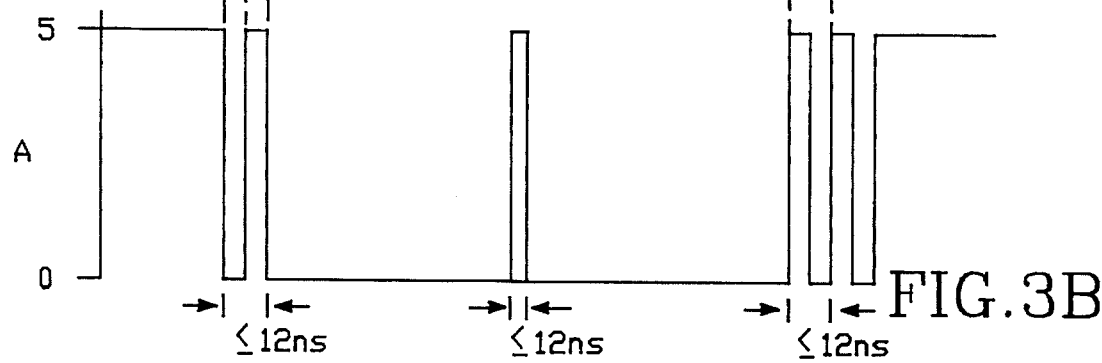
FIG. 3B shows a signal obtained at point A in the circuitry of FIG. 2.

FIG. 3B shows a signal obtained at point A at the output of Schmitt trigger 400. The Schmitt trigger 400 of the first stage, preferably has a transfer characteristic so that a signal received at the input IN of circuitry 200 shown by the curve in FIG. 3A is converted to a signal as shown in FIG. 3B. The Schmitt trigger transfer characteristic enables the Schmitt trigger to change to a HIGH state when a signal above a voltage level represented by VIH in FIG. 3A is received, and to change to a LOW state when a signal represented by VIL in FIG. 3A is received to create a signal as shown in FIG. 3B.

As shown in FIG. 3B, ground bounce and switching noise without considering reflections are usually less than 10 nanoseconds and occurs on both the rising and falling edges of a signal pulse on the SCSI bus. All these noises, including noises 304 between 302 and 306 which have not been present in previous circuitry are eliminated by the first two filter circuits 500A and 500B in FIG. 2.

Figure 3C:
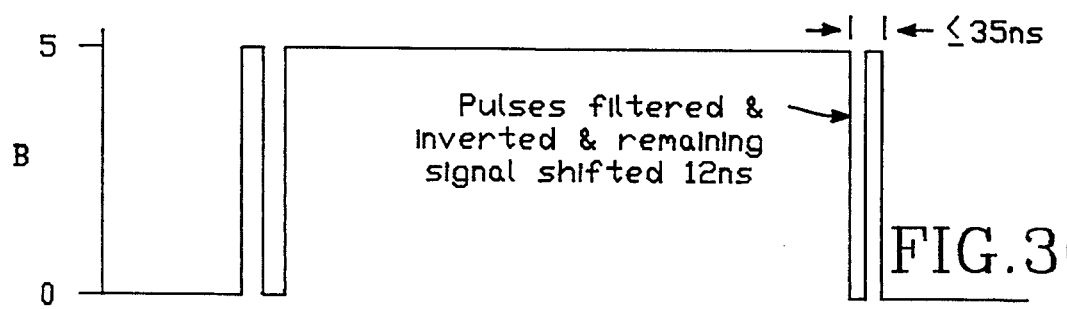
FIG. 3C shows a signal obtained at point B in the circuitry of FIG. 2.

FIG. 3C shows a signal obtained at point B at the output of filter 1, labeled 500A. As shown, filter 1 removes the noise signals of less than a 12 nanosecond duration on the negation edge of the pulse and provides an inverted output signal at point B.

Figure 3D:
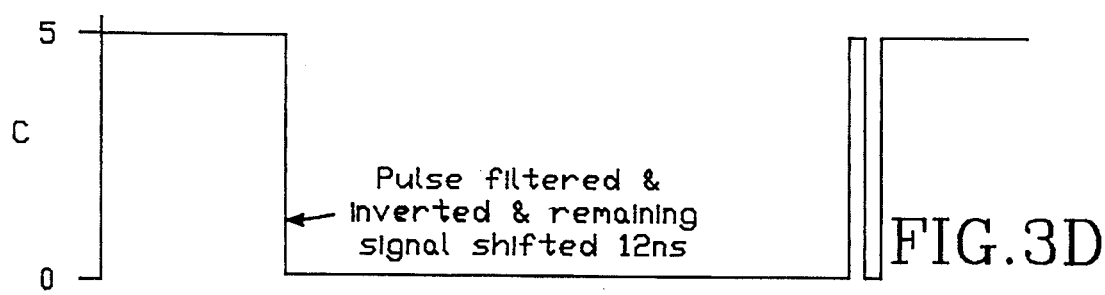
FIG. 3D shows a signal obtained at point C in the circuitry of FIG. 2.

FIG. 3D shows a signal obtained at point C at the output of filter 2, labeled 500B. As shown, filter 2 removes the noise signals of less than 12 nanosecond duration on the assertion edge of the pulse and provides an inverted output signal at point C. The noise eliminated by filter 2 is due to reflections on the long SCSI cable, hence causing the inversion of noise due to switching and ground bounce eliminated by filter 1.

Figure 3E:
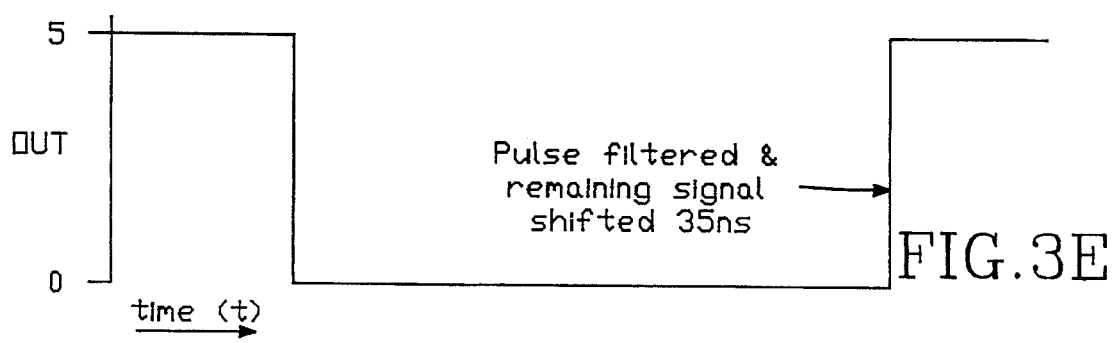
FIG. 3E shows the output signal (OUT) of the circuitry of FIG. 2.

FIG. 3E shows the output signal (OUT) at the output of filter 3, labeled 600. Filter 3 eliminates conventional noise of less than a 35 nanosecond duration which is typically found on a SCSI bus.

Figure 1:
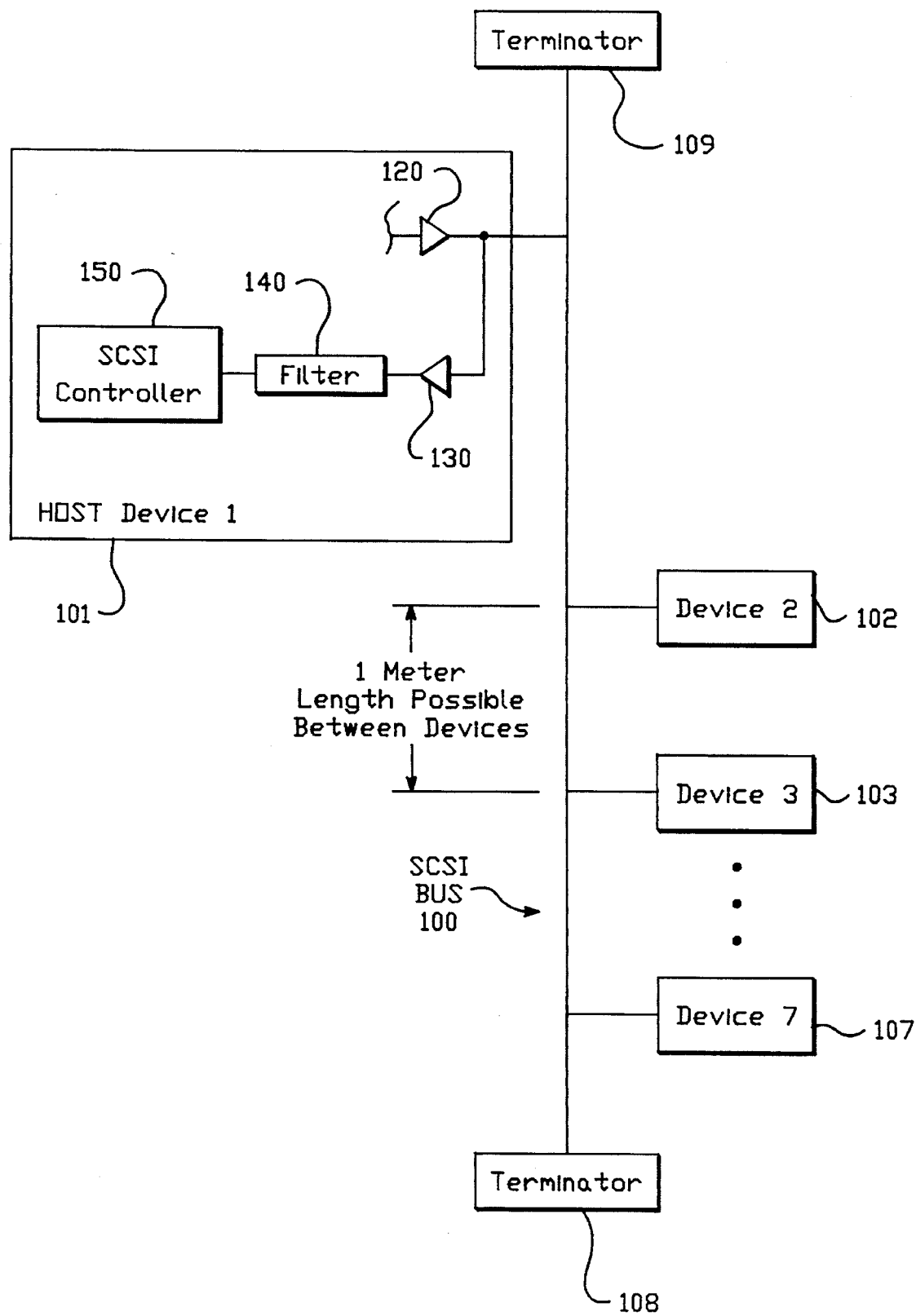
FIG. 1. illustrates the configuration of a SCSI bus with connecting devices.
Figure 4:
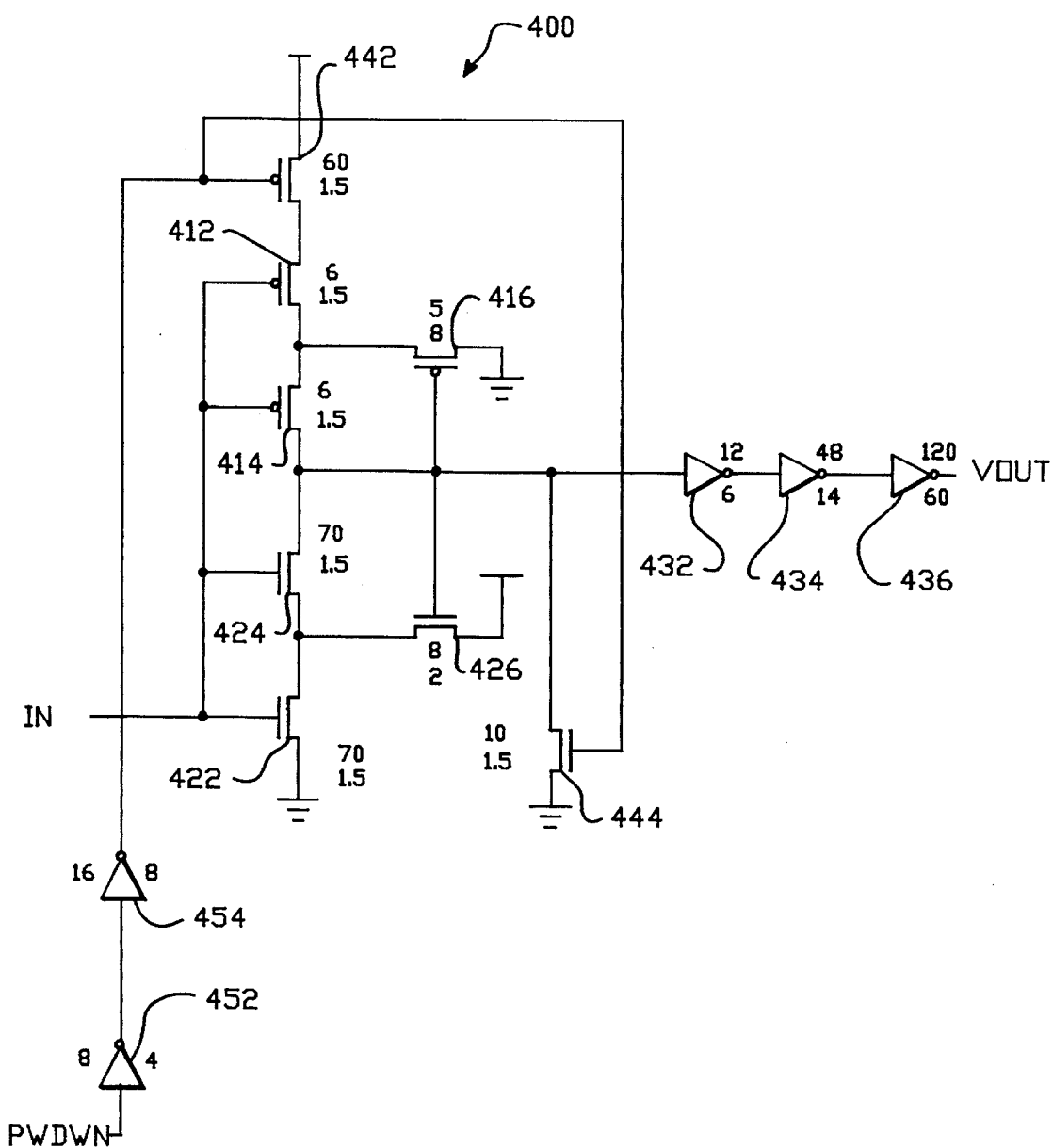
FIG. 4 shows detailed circuitry for the Schmitt trigger of FIG. 2.
Figure 4:
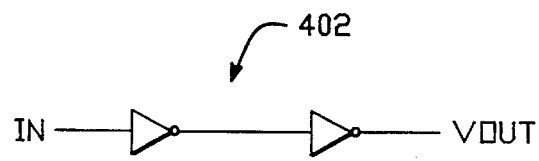

Note that with a 48 milliamp driver current called for by the SCSI bus specification, a delay of less than 5 ns can be typically created by the pull down transistors of an output buffer of an active device. resulting in the noise of less than 12 ns Pull up can be provided by the terminators on the SCSI bus as shown in FIG. 1, and the delay created by these devices is slower, typically on the order of 35 ns. resulting in the noise of less than 35 ns Schmitt Trigger FIG. 4 shows detailed circuitry for the Schmitt trigger 400 of FIG. 2, along with a logic diagram 402 for the Schmitt trigger which includes two inverters. The Schmitt trigger type buffer circuit 400 includes a plurality of N-channel transistors 412, 414, and 416, a plurality of P-channel transistors 422, 424, 426, an inverter gate 432 and output driver inverters 434 and 436. Also included in the circuitry of FIG. 2 are components utilized to prevent power flow from $V_{CC}$ to ground during power down. These components include a P-channel transistor 442, and an N-channel transistor 444 with gates driven by inverters 452 and 454. Note than in FIG. 4 as well as figures which follow, transistor sizes are indicated for the components shown.

In the Schmitt trigger circuitry, the gates of transistors 412, 414, 422, and 424 are connected to the signal VIN input received from an input buffer as described with respect to FIG. 2. The common drains of transistors 414 and 424 are connected to the input of inverter gate 432. The output of inverter gate 432 is provided through the two driver inverters 434 and 436 as connected in series to provide the output VOUT of the Schmitt trigger. The transistor 422 serves as a first load device with its drain connected to the source of transistor 424, and its source connected to a ground potential. Transistor 426 serving as a second load device has its drain connected to a supply potential $V_{CC}$ and its gate connected to the input of inverter 432. Transistor 414 has a source connected to the drain of transistor 412. The transistor 412, serving as a third load device has its source connected to the $V_{CC}$ supply through transistor 442. The transistor 416, serving as a fourth load device has its gate connected to the input of inverter 432 and its drain connected to ground.

When a signal having noise spikes is applied to the input terminal (IN) of the Schmitt trigger 400, the circuitry 400 will remove any noise spikes around the threshold point of its input on both the rising and falling edges of the input control signals. This is achieved by a hysteresis provided by transistors 422, 426, 412 and 416 as known to those skilled in the art. Consequently, the output voltage (VOUT) will appear as illustrated in FIG. 2B, with an input voltage (IN) applied as shown in FIG. 2A.

For a sleep mode, a power down signal PWDWN is provided through the two inverters 452 and 454 to the gates of transistors 442 and 444. The source and drain of transistor 442 are coupled between the $V_{CC}$ power supply and the source of transistor 412 to prevent power from flowing from $V_{CC}$ when PWDWN is HIGH, indicating a sleep mode. The source and drain of transistor 442 are coupled from the input of inverter 442 to ground to allow a flow of power to ground when PWDWN is HIGH, indicating a sleep mode. Thus, the sleep mode circuitry of Schmitt trigger 400 prevents the flow of power from $V_{CC}$ to ground during a sleep mode, but otherwise allow the flow of power from $V_{CC}$ to ground.

Filter Circuitry

Figure 5:
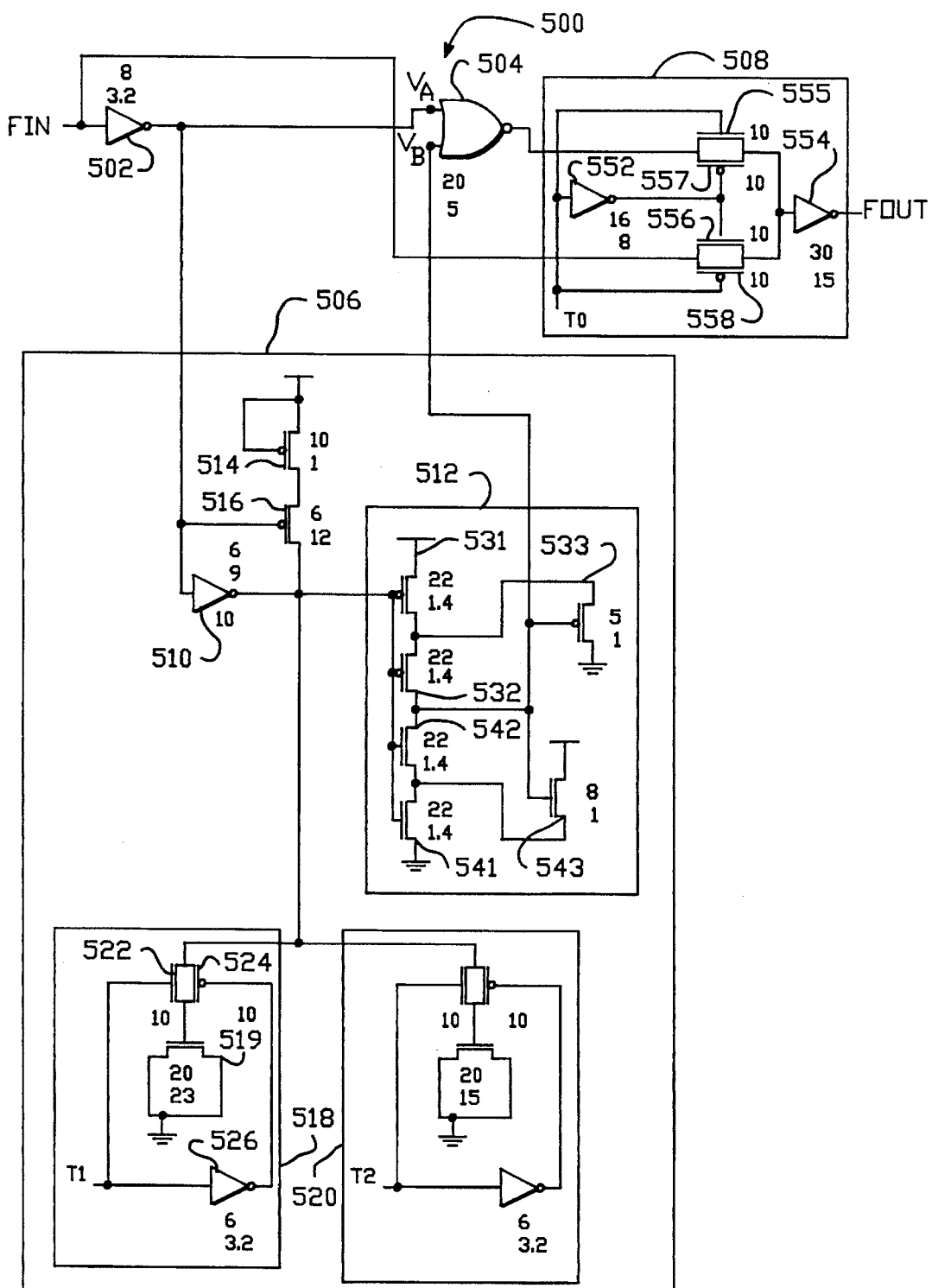
FIG. 5 shows detailed circuitry for filter 1 and filter 2 of FIG. 2.

FIG. 5 shows detailed circuitry 500 for filter 1 and filter 2 of FIG. 2. The filter circuitry 500 includes an inverter 502, a NOR gate 504, a delay circuit 506 and an enabling circuit 508. The filter input labeled FIN provides a signal to inverter 502 which provides input signal buffering. The output of inverter 502 is provided directly to a $V_A$ input of NOR gate 504, and through delay circuitry 506 to an input $V_B$ of NOR gate 504. The output of inverter 504 is provided through enabling circuit 508 to form the output (FOUT) of filter circuitry 500.

Delay circuitry 506 includes two inverters 510 and 512 connected in series between the output of inverter 502 and $V_B$. A capacitive delay is provided between inverters 510 and 512 by P-channel transistors 514 and 516 and by capacitive elements 518 and 520. Transistor 514 has its source and gate connected to $V_{CC}$ and its drain connected to the source of transistor 516. Transistor 516 has its gate connected to the output of inverter 502 and its drain connected to the output of inverter 510. Transistors 514 and 516 coupled with inverters 510 and 512 provide a 12 ns delay.

Capacitive elements 518 and 520 are coupled to the output of inverter 510 to increase the delay of delay circuitry 506. Signals T1 and T2 being HIGH enable the capacitive elements 518 and 520. Note that in the circuitry of FIG. 2, T1 and T2 are grounded because only a 12 ns delay is desired. Essentially, for the circuitry of filters 1 and 2 of FIG. 2, capacitive elements 518 and 520 can be removed. With one of the capacitive elements 518 and 520 turned on, the delay will increase to approximately 25 ns. With both 518 and 520 on, the delay will be approximately 35 ns.

The circuitry for capacitive elements 518 and 520 is similar and will be described with respect to only capacitive element 518. Capacitive element 518 includes a transistor 519 with its source and drain connected to ground and its gate connected to the output of inverter 510 through transistors 522 and 524, the transistor 519 acting as a capacitor. N-channel transistor 522 has its drain connected to the source of P-channel transistor 524 and to the output of inverter 510. N-channel transistor 522 has its source connected to the drain of P-channel transistor 524 and to the gate of transistor 519. The gate of transistor 522 is connected directly to T1, while the gate of transistor 524 is connected to the gate of transistor 524 through inverter 526. As such, when T1 is HIGH, current is provided through transistors 522 and 524 to transistor 519 which acts as a capacitor. With T1 LOW, transistors 522 and 524 cut off power to transistor 519.

The circuitry for inverter 512 includes three P-channel transistors 531, 532 and 533 and three N-channel transistors 541, 542 and 543 connected in a Schmitt trigger configuration. Transistors 531, 532, 533, 541, 542, and 543 are connected similar to transistors 412, 414, 416, 422, 424, and 426 of the Schmitt trigger 400 with the input of inverter 512 formed by the input (IN) of FIG. 4 and the output of inverter 512 formed by the input to inverter 432 of FIG. 4.

The enabling circuitry 508 includes two inverters 552 and 554, two N-channel transistors 555 and 556 and two P-channel transistors 557 and 558. Transistor 555 has a drain connected to the output of NOR gate 504 as well as to the source of transistor 557. The source of transistor 555 is connected to the drain of transistor 557 and to the input of output buffer 554. Transistor 556 has a-drain connected to the FIN input as well as to the source of transistor 558. The source of transistor 556 is connected to the drain of transistor 558 and to the input of output buffer 554. The gates of transistors 555 and 558 are connected directly to receive the signal T0. The gates of transistors 557 and 556 receive the signal T0 through inverter 552.

In operation, when T0 is HIGH, the filter 500 functions with the output of inverter 554 (FOUT) following the output of NOR gate 504. With T0 LOW, the filter is disconnected and the output of inverter 554 (FOUT) follows FIN.

With signals T1 and T2 being LOW, disabling the capacitance provided by capacitance elements 518 and 520, the inverters 510 and 512 along with capacitive elements 514 and 516 introduce a delay of approximately 12 nanoseconds. With T1 or T2 provided HIGH, the delay of 506 is increased to either 25 ns or 35 ns as discussed above.

Consequently, the delayed signal $V_B$ at the input of NAND gate 504 is the same as signal $V_A$ which is applied to the other input of NOR gate 504, but delayed by approximately 12 ns, assuming T1 and T2 are LOW. As discussed previously, a pulse of less than 12 ns is considered a glitch from the input buffer on a SCSI bus which is desired to be removed.

With a pulse applied at the input of filter 500 (FIN), a LOW signal will arrive at $V_A$ while a LOW will arrive at input $V_B$ 12 ns later. The output of NAND gate 504 remains LOW until a LOW is received from both inputs $V_A$ and $V_B$. Thus, with a pulse of less than 12 ns at the FIN input, $V_A$ and $V_B$ will never be LOW at the same time, and a corresponding change in the output signal FOUT indicative of the pulse will never be generated. With a pulse of greater than 12 ns at the FIN input, $V_A$ and $V_B$ will both go low after a delay of 12 ns, and a corresponding pulse will be delivered at FOUT delayed by approximately 12 ns.

Filters 1 and 2

Filters 1 and 2 are provided with T0 connected to $V_{CC}$ and T1-2 connected to ground, thus enabling the filter 500 and creating a delay of 12 ns. Note that the filter circuitry 500 only responds to a FIN signal which transitions from LOW to HIGH to LOW. Thus, by utilizing filter circuitry 500 as filter 1 of FIG. 2, only such LOW-HIGH-LOW pulses can be eliminated. Note also that the logic diagram 501 for the circuitry 500 is an inverter. Thus, even though HIGH-LOW-HIGH pulses less than 12 ns are not eliminated, they are inverted. Thus by providing two filters, filter 1 and filter 2 of FIG. 200 in series pulses less than 12 ns can be eliminated with LOW-HIGH-LOW transitions and with HIGH-LOW-HIGH transitions. Thus, noise due to large devices on the SCSI bus can be eliminated by filter 1, and reflections of such noise due to long cable lengths can be eliminated by filter 2.

Filter 3

FIG. 6 shows the circuitry 600 for filter 3. As shown, filter 3 includes the circuitry 500 of FIG. 5 followed by an additional inverter 602 to invert the signal inverted by the circuitry of FIG. 5. In the block diagram for filter 3 of FIG. 2, T0 is shown typically connected to $V_{CC}$ to activate the filter. Additionally, T1 and T2 are connected to $V_{DD}$ to provide a 35 ns delay.

Thus, the circuitry of FIG. 3 filters noise pulses less than 35 ns typically found on a SCSI bus, while filters 1 and 2 are provided to remove noise due to pulses less than 12 ns which may be provided by, more recently developed circuitry which can generate additional noise.

Although the invention has been described above with particularity, this was merely to teach one of ordinary skill in the art how to make and use the invention. Many modifications will fall within the scope of the invention, as that scope is defined by the claims which follow. For instance, although delays for filters 1 and 2 are disclosed as being provided at 12 ns and delay for filter 3 has been disclosed as set at 35 ns, it is possible to alter the delay length.

What is claimed is:

1. A glitch filter for removing noise from an interface bus signal, the glitch filter comprising:

a first filter for receiving the interface bus signal end removing positive pulses having a pulse width less than a first predetermined period to provide a first filter output;

a second filter for receiving the first filter output and removing negative pulses having a pulse width less than the first predetermined period to provide a second filter output; and a third filter for receiving the second filter output and removing positive pulses having a pulse width less than a second predetermined period to provide a glitch filter output.

2. The glitch filter of claim 1, wherein each of the first, second and third filters have an input and an output and wherein each of the first, second and third filters comprises:

a first inverter having an input coupled to its respective filter input and an output;

a second inverter having an input coupled to the first inverter output and an output;

a plurality of capacitive means, each capacitive means being responsive to a respective enabling signal to couple the first inverter output to a power potential; and a gating means having a first input coupled to the respective filter input, a second input coupled to the output of the second inverter, and an output for providing a signal having a first state when signals at both the first and second inputs of the gating means occupy a second state and otherwise providing a signal having the second state.

3. The glitch filter of claim 2 wherein each capacitive means in the plurality of capacitive means comprises:

a capacitive means inverter having an input receiving the respective enabling signal and an output;

a first n-channel transistor having a gate receiving the respective enabling signal, a drain connected to the output of the first inverter and a source;

a p-channel transistor having a gate connected to the output of the capacitive means inverter, a source connected to the output of the first inverter and a drain; and a second n-channel transistor having a source and drain connected to the power potential and a gate connected to the source of the first n-channel transistor and to the drain of the p-channel transistor.

4. The glitch filter of claim 2, wherein the interface bus signal is a SCSI bus signal, wherein a first predetermined delay is provided in each of the first and second filters from the input of the first inverter to the output of the second inverter, and wherein a second predetermined delay is provided in the third filter from the input of the first inverter to the output of the second inverter.

5. The glitch filter of claim 1 included in a combined SCSI and Ethernet controller on a single integrated circuit chip, the glitch filter providing a glitch filter output to the combined SCSI and Ethernet controller, the glitch filter further comprising:

a Schmitt trigger having an input for receiving the interface bus signal and an output for coupling the interface bus signal to the first filter, wherein the first filter comprises:
a first pair of inverters connected in series, the first pair of inverters having an input coupled to the Schmitt trigger output and an output, wherein the signal provided at the Schmitt trigger output is delayed from the input to the output of the first pair of inverters by the first predetermined period; and a first NOR gate having a first input coupled to the Schmitt trigger output, a second input coupled to the output of the first pair of inverters and an output, wherein the second filter comprises:
a second pair of inverters connected in series, the second pair of inverters having an input coupled to the first NOR gate output and an output, wherein a signal provided at the first NOR gate output is delayed from the input to the output of the second pair of inverters by the first predetermined period; and a second NOR gate having a first input coupled to the output of the first NOR gate, a second input connected to the output of the second pair of inverters and an output, and wherein the third filter comprises:
a third pair of inverters connected in series, the third pair of inverters having an input coupled to the second NOR gate output and an output, wherein a signal provided at the second NOR gate output is delayed from the input to the output of the third pair of inverters by the second predetermined period; and a third NOR gate having a first input coupled to the output of the second NOR gate, a second input connected to the output of the third pair of inverters and an output; and an output inverter having an input connected to the third NOR gate output and an output providing the glitch filter output.

6. The glitch filter of claim 1, wherein the first filter and second filter consist of substantially identical circuit components, while the third filter comprises the substantially identical circuit components along with an additional inverter.

7. The glitch filter of claim 2, wherein the first filter and second filter consist of substantially identical circuit components, while the third filter comprises the substantially identical circuit components along with an additional inverter.

8. The glitch filter of claim 2, wherein the gating means comprises a NOR gate.

9. A glitch filter for filtering noise from an interface bus signal comprising a plurality of filters connected in series, each of the plurality of filters having an input and an output, with the input of a first filter in the series being coupled to receive the interface bus signal, and the inputs of remaining filters in the series being coupled to the output of a preceding filter in the series, wherein each of the plurality of filters comprises:

a delay means having an input coupled to its respective filter input and an output providing a delayed version of a signal received at its input;

a gating means having a first input coupled to the input of the delay means, a second input coupled to the output of the delay means, and an output for providing a signal having a first state when signals at both the first and second inputs of the gating means occupy a second state and otherwise providing a signal having the second state; and a filter enabling means having a first input coupled to the gating means output, a second input coupled to its respective filter input, a third input coupled to receive an enabling signal, and an output for outputting a signal received at the first input of the filter enabling means when the enabling signal is active and for outputting a signal received at the second input of the filter enabling means when the enabling signal is inactive.

10. The glitch filter of claim 9, wherein the filter enabling means comprises;

an enabling means inverter having an input receiving the enabling signal and an output;

a first n-channel transistor having a gate receiving the enabling signal, a drain connected to the gating means output and a source connected to the filter enabling means output;

a first p-channel transistor having a gate connected to the enabling means inverter output, a source connected to the gating means output and a drain connected to the filter enabling means output;

a second n-channel transistor having a gate connected to the enabling means inverter output, a drain connected to its respective filter input and a source connected to the filter enabling means output; and a second p-channel transistor having a gate receiving the enabling signal, a source connected to its respective filter input and a drain connected to the filter enabling means output.

11. The glitch filter of claim 9 wherein the delay means comprises:

a first inverter having an input coupled to its respective filter input and an output; and a second inverter having an input coupled to the first inverter output and an output coupled to the second input of the gating means.

12. The glitch filter of claim 9 wherein the gating means comprises a NOR gate.

13. The glitch filter of claim 9 further comprising:

a Schmitt trigger for coupling the interface bus signal to the input of the first filter in the series.

* * * * *

UNITED STATES PATENT AND TRADEMARK OFFICE
CERTIFICATE OF CORRECTION

PATENT NO. : 5,563,532
DATED : October 8, 1996
INVENTOR(S) : Wu, et al.

Page 1 of 2

It is certified that error appears in the above-indentified patent and that said Letters Patent is hereby corrected as shown below:

Col. 1, line 41, after "Controller", delete " " " and after "Bus" insert --"--.

Col. 2, line 3, after "negation of", insert --the--.

Col. 3, line 38, after "device", delete ".".

Col. 3, line 39, after "ns" insert --.--.

Col. 3, line 41, after "ns" delete ".".

Col. 3, line 42, after "ns" insert --.--.

Col. 3, line 58, delete "signal VIN" and after "input" insert --signal IN--.

Col. 5, line 15, after "connected" insert --in a manner--.

Col. 5, line 25, delete "a-drain" and insert --a drain--.

UNITED STATES PATENT AND TRADEMARK OFFICE
CERTIFICATE OF CORRECTION

PATENT NO. : 5,563,532
DATED : October 8, 1996
INVENTOR(S) : Wu, et al

It is certified that error appears in the above-indentified patent and that said Letters Patent is hereby corrected as shown below:

Col. 6, line 34, after "signal" delete "end" and insert -- and--.

Signed and Sealed this

Twenty-eighth Day of January, 1997

Attest:

BRUCE LEHMAN

Attesting Officer    Commissioner of Patents and Trademarks